US 9,459,324 B2

(12) United States Patent
Boehm et al.

(10) Patent No.: US 9,459,324 B2
(45) Date of Patent: Oct. 4, 2016

(54) DEVICE AND METHOD FOR THE REDUNDANT DETERMINATION OF A BATTERY CURRENT FLOWING THROUGH THE POLES OF A BATTERY

(71) Applicants: Robert Bosch GmbH, Stuttgart (DE); Samsung SDI Co., Ltd., Yongin-si, Gyeonggi-do (KR)

(72) Inventors: Andre Boehm, Kornwestheim (DE); Stefan Wickert, Albershausen (DE); Anne Heubner, Stuttgart (DE); Sven Bergmann, Stuttgart (DE); Stefan Butzmann, Beilstein (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 464 days.

(21) Appl. No.: 13/855,809

(22) Filed: Apr. 3, 2013

(65) Prior Publication Data

US 2013/0257444 A1 Oct. 3, 2013

(30) Foreign Application Priority Data

Apr. 3, 2012 (DE) .................. 10 2012 205 401

(51) Int. Cl.
*G01R 31/36* (2006.01)
*B60L 11/18* (2006.01)

(52) U.S. Cl.
CPC ........ *G01R 31/3624* (2013.01); *B60L 11/1851* (2013.01); *Y02T 10/7005* (2013.01); *Y02T 10/705* (2013.01)

(58) Field of Classification Search
CPC .................................................. G01R 31/3624
USPC .......................................................... 324/434
See application file for complete search history.

(56) References Cited

U.S. PATENT DOCUMENTS

| 2005/0212548 | A1* | 9/2005 | Kim ........................ H02P 6/12 324/765.01 |
| 2008/0298784 | A1* | 12/2008 | Kastner ........................ 388/811 |
| 2009/0206841 | A1 | 8/2009 | Weng |
| 2009/0256521 | A1* | 10/2009 | Mori ..................... H02J 7/0047 320/108 |

(Continued)

FOREIGN PATENT DOCUMENTS

| CN | 102104176 A | 6/2011 |
| DE | 103 43 179 A1 | 4/2005 |

(Continued)

*Primary Examiner* — Edward Tso
*Assistant Examiner* — Dung V Bui
(74) *Attorney, Agent, or Firm* — Maginot, Moore & Beck LLP

(57) ABSTRACT

A device comprises a battery having a multiplicity of battery cells and a sensor system for the redundant determination of a battery current flowing through the poles of the battery. The sensor system comprises a current measuring device for detecting the battery current and providing a current measurement value. Furthermore, the device comprises a voltage measuring device for separately detecting a variation with time of the single-cell voltage of at least one battery cell and providing at least one variation with time of a voltage measurement value. Furthermore, the device comprises an evaluating unit which is configured for determining the battery current from the at least one variation with time of the voltage measurement value, providing a corresponding current value and comparing the current value with the current measurement value.

9 Claims, 3 Drawing Sheets

(56) References Cited

U.S. PATENT DOCUMENTS

| | | | |
|---|---|---|---|
| 2010/0004885 A1* | 1/2010 | Nakanishi | B60L 3/0046 702/63 |
| 2012/0119745 A1* | 5/2012 | Deveau | G01R 31/3631 324/429 |
| 2012/0310562 A1* | 12/2012 | van Lammeren et al. | 702/63 |
| 2013/0060497 A1* | 3/2013 | Bito | 702/63 |
| 2013/0257444 A1* | 10/2013 | Boehm | G01R 31/3624 324/434 |

FOREIGN PATENT DOCUMENTS

| | | |
|---|---|---|
| DE | 10 2010 047 960 A1 | 6/2011 |
| DE | 10 2011 080 703 A1 | 2/2013 |

* cited by examiner

DEVICE AND METHOD FOR THE REDUNDANT DETERMINATION OF A BATTERY CURRENT FLOWING THROUGH THE POLES OF A BATTERY

This application claims priority under 35 U.S.C. §119 to patent application no. DE 10 2012 205 401.4, filed on Apr. 3, 2012 in Germany, the disclosure of which is incorporated herein by reference in its entirety.

BACKGROUND

The present disclosure relates to a device comprising a battery having a multiplicity of battery cells and a sensor system for the redundant determination of a battery current flowing through the poles of the battery. Furthermore, the disclosure relates to a method for the redundant determination of the battery current flowing through the poles of a battery.

Batteries are increasingly gaining significance as energy stores, especially for propulsion systems of vehicles. To determine the charging state of the batteries and also for safety reasons, the current flow in and out of the battery or also the current flow of the individual battery cells is measured. Since a defective current sensor endangers not only the correct operation of the vehicle drive but also represents a safety risk, it must be continuously monitored.

In many cases, a shunt is used for measuring current. Such shunt current sensors measure a voltage drop whereupon the current flowing through the shunt can be determined with the aid of Ohm's law. Since a large additional resistance is undesirable in the circuit, the resistance of the shunt is selected to be very much smaller than that of the load. Due to the small resistance, the voltage only drops slightly across it in consequence. This small voltage drop is amplified and evaluated by means of electronic circuits. In order to detect a defect of the shunt or of the measuring electronics and be able to respond to it, well thought-out monitoring strategies are needed.

Safety-related electrical and/or electronic systems in motor vehicles are subject to the ISO 26262 Standard. In this context, an Automotive Safety Integrity Level (ASIL) represents a safety requirement level, specified by ISO 26262, for safety-related systems in motor vehicles having the grades A to D. ASIL D designates the safety requirement stage having the highest requirements for safety.

For a sensor developed, e.g., according to ASIL C, imaging redundant or diversitary measuring paths is the state of the art. Measuring a diversitary measurement value, for example an electrical current, can be guaranteed, e.g., by using a second sensor of a different type of construction.

Such an arrangement is shown diagrammatically in FIG. 1. According to this, a current is measured by means of two mutually independent current sensors.

In this arrangement, a first current sensor 10 can be constructed as current sensor with a shunt. A measurement signal is evaluated in a current measuring ASIC 12 (application-specific integrated circuit). In addition, the first current sensor 10 comprises a separate diagnostic unit 14 which monitors the operability of the first current sensor 10 and a microcontroller 16 which conditions a first current measurement value $I_{MS}$ for output.

In contrast to the first current sensor 10, the second current sensor 20 is constructed as a current sensor with a Hall sensor. A measurement signal is again evaluated in a current measuring ASIC 22. In addition, the second current sensor 20 also comprises a separate diagnostic unit 24 which monitors the operability of the second current sensor 20 and a microcontroller 26 which conditions a second current measurement value $I_{MH}$ for output.

The current measurement value $I_{MS}$ of the first current sensor 10 and the current measurement value $I_{MH}$ of the second current sensor 20 are transferred to an evaluating unit 30. The evaluating unit 30 comprises a further microcontroller 32 which compares and qualifies the current measurement values $I_{MS}$ and $I_{MH}$. The evaluating unit 30 delivers a qualified current output value $I_Q$ as output variable.

A further method is integrating comparators into the current sensor. In this arrangement, e.g., the voltage across the shunt is conducted into a measuring IC (integrated circuit), on the one hand, and on the other hand, the voltage is compared with a threshold voltage. If the threshold value is exceeded, the higher-level controller can evaluate a hardware signal and take measures.

DE 10 343 179 A1 describes a device for determining a current flow of a vehicle battery. As usual, the current is conducted into a fuse box and conducted there in parallel via a number of fuses. The voltage drops at the fuses are measured in order to determine the total current which can be considered with a battery status detector. The part-currents through individual fuses can be checked so that when a limit current is exceeded, a fault can be assumed.

DE 10 2011 080 703.2 describes a method for measuring electrical current. In this context, the current to be measured is divided to at least two paths arranged in parallel. Subsequently, the part-current flowing through each path is measured by a current sensor. In order to determine the total current, the two part-currents are added. To check the plausibility of the measured part-currents, a ratio of the two part-currents is formed. This ratio can be compared, e.g., with a ratio recorded in the definitely operative state and formed in the same way.

SUMMARY

According to the disclosure, a device is provided which comprises a battery having a multiplicity of battery cells and a sensor system for the redundant determination of a battery current flowing through the poles of the battery, wherein the sensor system comprises a current measuring means for detecting the battery current and providing a current measurement value. Furthermore, the sensor system comprises a voltage measuring means for separately detecting a variation with time of the single-cell voltage of at least one battery cell and providing at least one variation with time of a voltage measurement value. Furthermore, the sensor system comprises an evaluating unit which is configured for determining the battery current from the at least one variation with time of the voltage measurement value. In addition, the evaluating unit is configured for providing a corresponding current value and comparing the current value with the current measurement value.

The current measurement value, the current value and the voltage measurement value are provided in such a manner that they are available at least for the evaluating unit. The voltage measuring means can be constructed for separately detecting variations with time of the single-cell voltages of a number of battery cells or preferably all battery cells of the battery.

Depending on the design of the device, the current measuring means can also detect a variation with time of the battery current and provide a variation with time of the current measurement value. The evaluating unit can determine a variation with time of the battery current and provide a variation with time of the current value. Following this, the evaluating unit can compare the variation with time of the current measurement value with the variation with time of the current value.

The disclosure is based on the finding of being able to realize a diversitarily redundant determination of a battery current by using a current measuring means, e.g. a current sensor and a voltage measuring means, e.g. at least one voltage sensor in combination with a suitable evaluating unit.

This is possible since a different single-cell voltage can be measured at a battery cell depending on the current taken from it or supplied to it, the single-cell voltage being understood to be the voltage which can be picked up between the poles of the battery cell. In addition, the battery cell exhibits a characteristic variation with time of its single-cell voltage in the case of a change of the current taken from it or supplied to it.

For this reason, the current flowing can be inferred by means of the detected variation with time of the single-cell voltage by means of the evaluating unit which, as a rule, comprises a battery model. For this purpose, the voltage measuring means should be highly accurate in order to be able to calculate a sufficiently accurate battery current from the variation of the voltage measurement value. As a rule, the battery model is a mathematical model of the at least one battery cell, the variation with time of the single-cell voltage of which is measured. As input variable for the battery model, at least the at least one variation with time of the voltage measurement value is used; the battery model supplies at least the current value as output variable.

This current value determined by means of the at least one variation in time of the voltage measurement value, which corresponds to the battery current, can now be compared with the current measurement value. As a result, the current measurement value can be validated. For example, a current measurement value can be considered to be valid when the current value is within a predefined tolerance range around the current measurement value. A qualified current output value can be output subsequently by the evaluating unit.

Due to the disclosed device, the redundant measurement of the battery current becomes smaller, more flexible and more inexpensive without loss of safety. This now only requires a single current measuring means, and the voltage measuring means exists in any case in the battery, as a rule, which results in advantages with respect to the price and space requirement. An essential advantage lies in an increased flexibility since the main expenditure can be imaged by flexible software.

As the current measuring means, at least one current sensor is preferred. Furthermore, the at least one current sensor is preferably a current sensor with a shunt. Shunt current sensors have been found to be successful for automobile application due to their characteristics. Furthermore preferably, current sensors can also be used the operation of which is based on the Hall effect.

Furthermore preferably the current measuring means comprises a current measuring ASIC (application-specific integrated circuit). The current measuring ASIC determines or calculates the current measurement value from the voltage dropped across the shunt. Analogously, the voltage measuring means can also comprise a voltage measuring ASIC which determines or calculates the voltage measurement value.

Furthermore preferably, the sensor system comprises a current measuring diagnostic unit for monitoring the operability of the current measuring means and/or a voltage measuring diagnostic unit for monitoring the operability of the voltage measuring means. The diagnostic units are constructed for monitoring, e.g., the hardware of the current measuring and/or voltage measuring means. For example, the diagnostic unit can send a test current through the shunt in order to thus check whether the shunt is operable.

Especially preferably, the voltage measuring diagnostic unit comprises monitoring the measuring accuracy of the voltage measuring means, as a result of which the voltage measuring diagnostic unit is constructed especially for monitoring the measuring accuracy of the voltage measuring means. As a result, changes in the measuring accuracy of the voltage measuring means over the operating time can be detected.

Furthermore preferably, the current measuring diagnostic unit and/or the voltage measuring diagnostic unit in each case comprises or comprise a watchdog. This is constructed, for example, for monitoring the current measuring ASIC or the voltage measuring ASIC or especially monitoring a microcontroller on the software side. For example, a software can inform the watchdog at regular intervals previously known to the watchdog that it is operable. If this message is missing, the watchdog can initiate a reset and restart the software.

Especially preferably, the current measuring diagnostic unit and the voltage measuring diagnostic unit can comprise a common watchdog. The common watchdog handles the tasks of the watchdog of the voltage measuring diagnostic unit and the tasks of the watchdog of the current measuring diagnostic unit.

The evaluating unit preferably comprises a microcontroller which can also be used by the current measuring diagnostic unit and/or the voltage measuring diagnostic unit. Furthermore preferably, the current measuring diagnostic unit and/or the voltage measuring diagnostic unit are a component of the evaluating unit, the evaluating unit and the microcontroller being constructed in such a manner that the microcontroller can be used by the current measuring diagnostic unit and/or the voltage measuring diagnostic unit. Due to this embodiment, tasks which are otherwise executed on separate microcontrollers of the respective diagnostic unit are executed on the same microcontroller. Due to this embodiment, a number of components, e.g. other microcontrollers, can be saved in the current measuring means and/or voltage measuring means which can be reflected in a lower price.

Preferably, the battery is a lithium-ion battery comprising a multiplicity of lithium-ion battery cells (secondary cells). Lithium-ion battery cells are distinguished by a high energy and power density which results in further advantages particularly in the area of electrotraction.

Furthermore, a motor vehicle having the device according to the disclosure is provided. As a rule, the battery is provided for feeding an electrical propulsion system of the vehicle.

Furthermore, a method for the redundant determination of a battery current flowing through the poles of a battery is provided. The method comprises a first step of providing a battery with a multiplicity of battery cells and a sensor system comprising a current measuring means, a voltage measuring means and an evaluating unit. The method also comprises a second step of detecting the battery current by means of the current measuring means and providing a current measurement value. Furthermore, the method comprises a third step of simultaneously detecting a variation with time of the single-cell voltage of at least one battery cell using the voltage measuring means and providing at least one variation with time of a voltage measurement value. In a fourth step, the battery current is determined from the at least one variation with time of the voltage measurement value and a corresponding current value is provided using the evaluating unit. In a fifth step, the current measurement value is compared with the current value using the evaluating unit.

Providing the current measurement value, the current value and the voltage measurement value is carried out in such a manner that these values are available at least for the evaluating unit.

By means of the method, the variation with time of the single-cell voltage of at least one battery cell and the battery current of the battery are detected simultaneously. If the single-cell voltage of only one battery cell is detected, the entire battery is inferred from one battery cell. However, the variations with time of the single-cell voltages of a number of battery cells can also be detected as a result of which, e.g., the variations with time of the single-cell voltages can be balanced with respect to one another.

Preferably, the variations with time of the single-cell voltages of all battery cells are detected in the third step and the variations with time of all voltage measurement values are provided. In the fourth step, the battery current is determined from all variations of the voltage measurement values. By this means, influences on the measurement result which can arise from fluctuations in the characteristics of individual battery cells can be brought under control.

Depending on the design of the method, a variation with time of the battery current can also be detected by means of the current measuring means and a variation with time of the current measurement value can be provided. By means of the evaluating unit, a variation with time of the battery current can be determined and a variation with time of the current value can be provided corresponding to the variation with time of the battery current. Following this, the variation with time of the current measurement value can be compared with the variation with time of the current value by means of the evaluating unit.

As already described, the method according to the disclosure is possible since a battery cell has a different single-cell voltage depending on the current taken from it or supplied to it, the single-cell voltage being understood to be the voltage which can be tapped off across the poles of the battery cell. In addition, the battery cell exhibits a characteristic variation with time of its single-cell voltage in the case of a change of the current taken from it or supplied to it. For this reason, the flowing current can be inferred by means of the evaluating unit using the detected variation with time of the single-cell voltage.

The determining of the battery current according to the fourth step of the method can take place by means of a battery model. As a rule, the battery model is a mathematical model of the at least one battery cell, the variation with time of the single-cell voltage of which is measured. As the input variable of the battery model, at least the at least one variation with time of the voltage measurement value is used, and as the output variable, the battery model supplies at least the current value.

The current value determined by means of the at least one variation with time of the voltage measurement value, which corresponds to the battery current, can now be compared with the current measurement value. By this means, the current measurement value can be validated. For example, a current measurement value can be considered to be valid if the current value is within a predefined tolerance range around the current measurement value. A qualified current output value can be output subsequently by the evaluating unit.

Preferably, the fourth step of the method occurs only on detection of a gradient in the at least one variation with time of the voltage measurement value of greater than a predetermined limit gradient. Furthermore preferably, the fourth step of the method only occurs on detection of a jump in the current measurement value of greater than a limit jump. Due to these embodiments, the battery current is determined from the at least one variation with time of the voltage measurement value only when a sufficiently informative variation with time of the single-cell voltage can be expected.

Furthermore preferably, the method comprises a step of evaluating a measurement signal of the current measuring means by means of the current measuring ASIC (application-specific integrated circuit) and/or a step of evaluating a measurement signal of the voltage means by means of the voltage measuring ASIC. The current measuring ASIC determines or calculates the current measurement value from the voltage dropped across the shunt. Analogously, the voltage measuring means can also comprise a voltage measuring ASIC which determines or calculates the voltage measurement value.

Furthermore preferably, the method comprises a step of monitoring the current measuring means by means of a current measuring diagnostic unit; and/or a step of monitoring the voltage measuring means by means of the voltage measuring diagnostic unit.

Especially preferably, the method comprises a step of monitoring the measuring accuracy of the voltage measuring means by the voltage measuring diagnostic unit.

Furthermore preferably, the method comprises a step of monitoring the current measuring means and/or the voltage measuring means by means of in each case one watchdog or by means of a common watchdog.

BRIEF DESCRIPTION OF THE DRAWINGS

Exemplary embodiments of the disclosure will be explained in greater detail with reference to the drawings and the subsequent description, in which.

DETAILED DESCRIPTION

Figure 1:
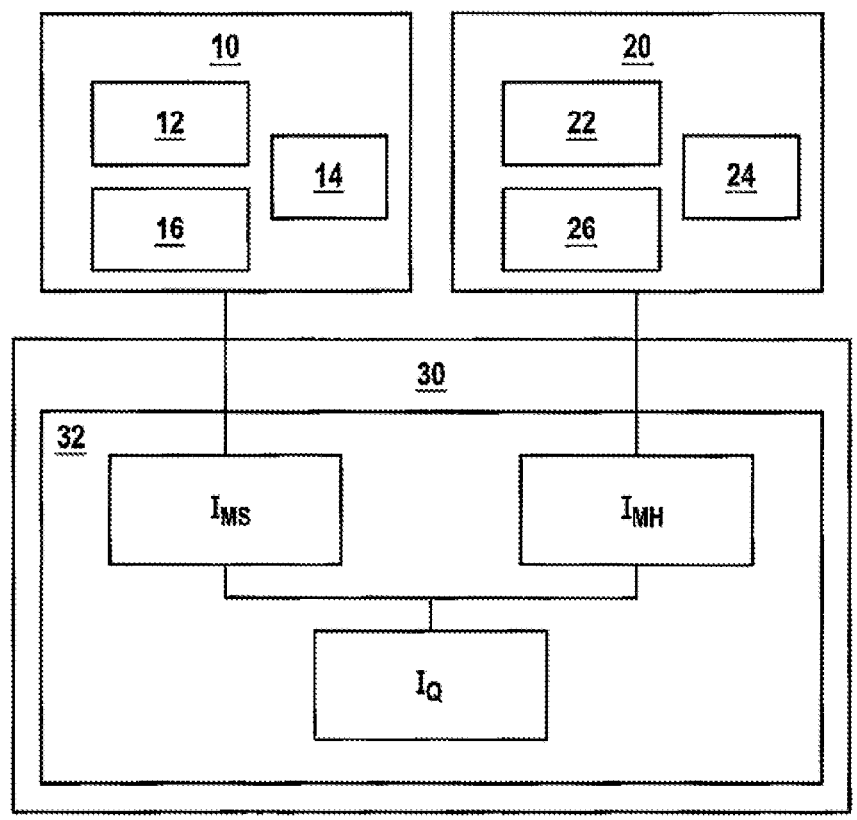
FIG. 1 shows a prior art sensor system.
Figure 2:
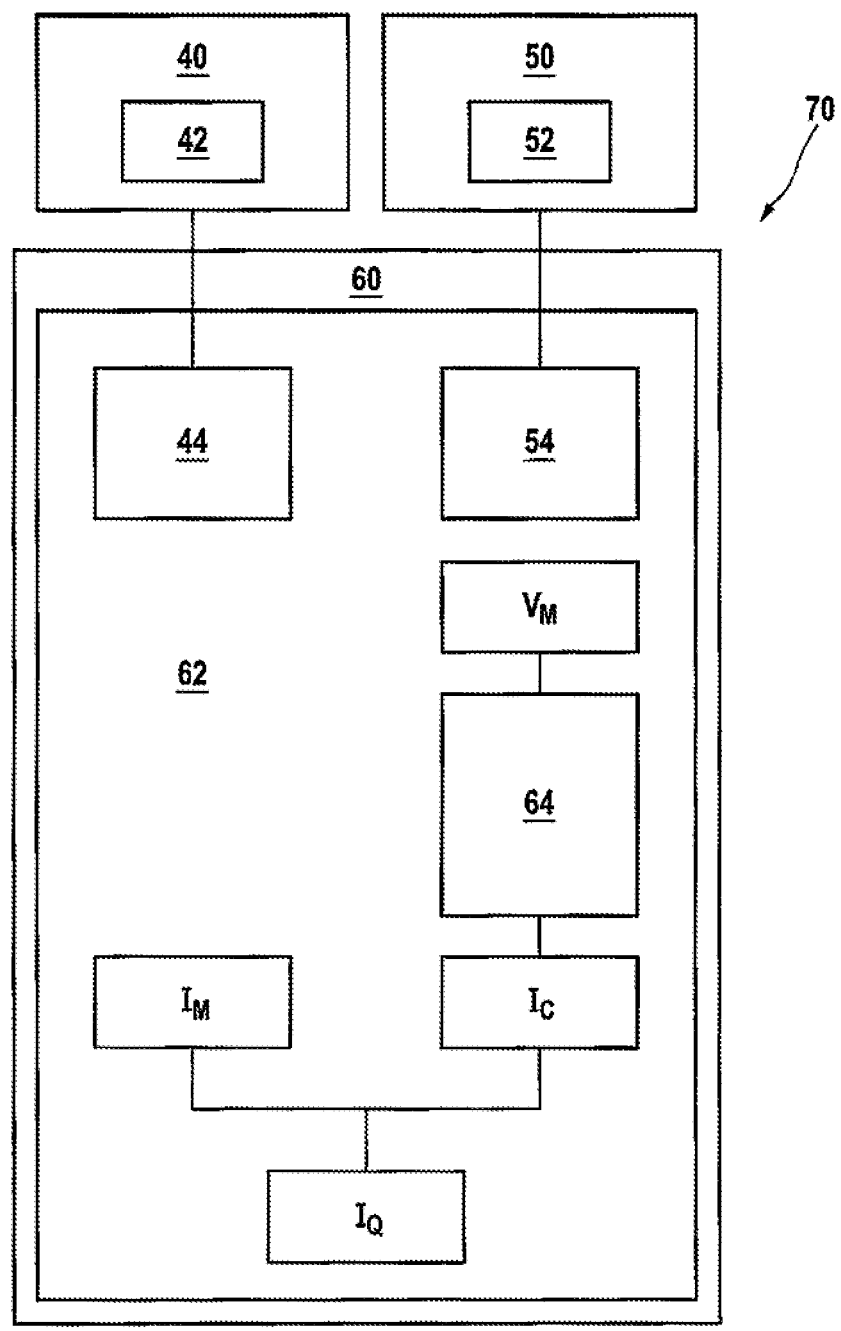
FIG. 2 shows a diagrammatic configuration of the sensor system according to the disclosure.

FIG. 2 diagrammatically shows a sensor system 70 which is a part of the device according to the disclosure. The sensor system 70 comprises a current measuring means 40, a voltage measuring means 50 and an evaluating unit 60. The current measuring means 40 is, for example, a current sensor comprising a shunt and the voltage measuring means 50 is a voltage sensor. The current measuring means 40 can comprise a current measuring ASIC 42 (application-specific integrated circuit); analogously, the voltage measuring means 50 can comprise a voltage measuring ASIC 52. As a rule, the evaluating unit 60 comprises a microcontroller 62 on which a battery model 64 can be implemented and also stored depending on the type of microcontroller 62. Furthermore, a current measuring diagnostic unit 44 and a voltage measuring diagnostic unit 54 can also be connected to the microcontroller 62 in such a manner that it can be used by the current measuring diagnostic unit 44 and the voltage measuring diagnostic unit 54.

In order to determine a battery current, that is to say the current which flows through the poles of a battery, redundantly according to the disclosure, the current measuring means 40 detects the battery current via a direct or indirect measuring principle and provides a current measurement value $I_M$ for further processing. This is carried out, for example, via the current measuring ASIC 42 which calculates the battery current from a voltage dropped across the shunt. At the same time, the voltage measuring means 50 detects a variation with time of a single-cell voltage of a battery cell and, by processing in the voltage measuring ASIC 52, provides a variation with time of a voltage measurement value $V_M$ for further processing.

The current measuring diagnostic unit 44, which, e.g., comprises a watchdog, monitors the current measuring means 40 and especially the current measuring ASIC 42. Analogously, the voltage measuring diagnostic unit 54, which can also comprise a watchdog, monitors the voltage measuring means 50 and especially the voltage measuring ASIC 52.

In order to attain a redundant determination of the battery current, a battery model 64 of the evaluating unit 60 determines a current value $I_C$ from the variation with time of the voltage measurement value $V_M$. For this purpose, the battery model 64 is a mathematical model of the battery cell, the variation with time of the single-cell voltage of which is measured.

Figure 3:
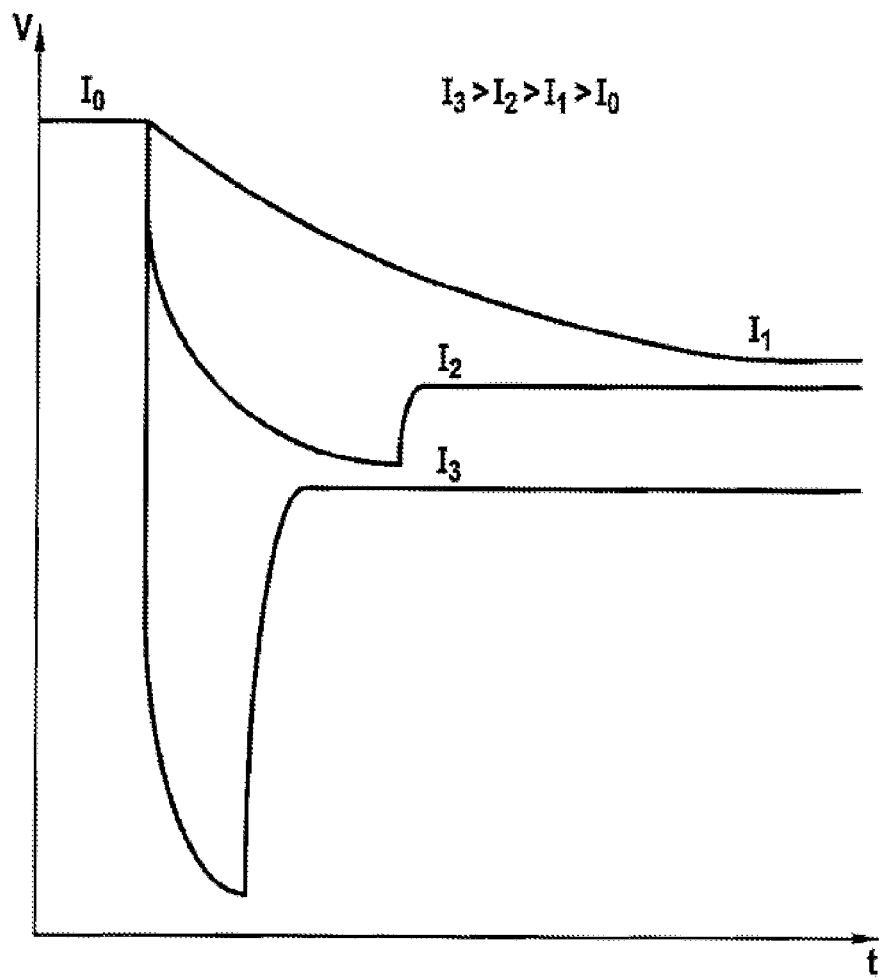
FIG. 3 shows variations with time of a single-cell voltage.

Variations of the single-cell voltage V with time t with a discontinuous removal of current from the battery cell are shown by way of example and qualitatively for illustration in FIG. 3. Starting with an equally high initial single-cell voltage with an initial current $I_0$, differently high final single-cell voltages are obtained depending on the amplitude of the discontinuously removed current. In this context, $I_1$ designates a relatively low current, $I_2$ a medium current and $I_3$ a relatively high current so that $I_3 > I_2 > I_1 > I_0$. The variations of the single-cell voltage with time are characteristic of each discontinuously removed current $I_1$, $I_2$ and $I_3$. By means of the battery model 64, the current can be counted back from selected interpolation points which has led to this voltage variation. In this manner, the battery model determines the current value $I_C$ which corresponds to the battery current.

This can take place, for example, only when a jump of the current measurement value $I_M$ of greater than a limit voltage is detected. If thus a significant change in the battery current is detected by means of the current measuring means 40, the battery current is determined by the evaluating unit 60 by means of the battery model 64. As an alternative, the battery current can also be determined only when a gradient is detected in the variation with time of the voltage measurement value $V_M$ of greater than a predetermined limit gradient.

The selected interpolation points for determining the battery current by means of the battery model can be, for example, maxima or minima in the variation with time of the voltage measurement value $V_M$ which have occurred immediately before or after the detection of the jump or of the gradient. The time interval within which these maxima or minima can be expected depends, e.g., on the battery cell type used.

Subsequently, the evaluating unit 60 compares the current measurement value $I_M$ with the current value $I_C$ and, after a validation, delivers a qualified current output value $I_Q$. For the qualified current output value $I_Q$, the current measurement value $I_M$ can be used, for example, or a mean value can be formed from the current measurement value $I_M$ and the current value $I_C$.

What is claimed is:

1. A device including a battery having a multiplicity of battery cells and a sensor system for redundant determination of a battery current flowing through poles of the battery, the sensor system comprising:
   a current measuring device configured to generate a first plurality of current measurement values corresponding to detected levels of current through the battery over time with reference to a plurality of measured levels of voltage values over time through a shunt resistor having a predetermined resistance and connected in parallel to the battery;
   a voltage measuring device configured to generate a second plurality of measurements of a voltage level of at least one battery cell in the battery over time; and
   an evaluating unit operatively connected to the current measuring device and the voltage measuring device, the evaluating unit being further configured to:
   identify a variation of the voltage of the battery cell over time with reference to the second plurality of measurements from the voltage measuring device;
   generate a second current measurement value corresponding to the variation in the second plurality of measurements of the voltage level over time with reference to an interpolation of the identified variation of the voltage level over time to a plurality of predetermined current level curves corresponding to a predetermined model of current output levels over a predetermined range of voltage variation levels for the battery over time and not to an internal resistance of the battery;
   identify a variation in the first plurality of current measurement values;
   determine a calculated battery current from the at least one variation with time of the voltage measurement value;
   generate a first output measurement of current flow through the battery corresponding to one current measurement value in the first plurality of current measurement values in response to the variation in the first plurality of current measurement values being less than a predetermined threshold; and
   generate a second output measurement of current flow through the battery corresponding to the second current measurement value in response to the variation in the first plurality of current measurement values being greater than the predetermined threshold.

2. The device according to claim 1, wherein the sensor system further comprises a current measuring diagnostic unit configured to monitor operability of the current measuring device.

3. The device according to claim 2, wherein the sensor system further comprises a voltage measuring diagnostic unit configured to monitor operability of the voltage measuring device.

4. The device according to claim 3, wherein the voltage measuring diagnostic unit monitors a measuring accuracy of the voltage measuring device.

5. The device according to claim 3, wherein at least one of the current measuring diagnostic unit and the voltage measuring diagnostic unit comprises a watchdog.

6. The device according claim 3, wherein the current measuring diagnostic unit and the voltage measuring diagnostic unit comprise a common watchdog.

7. The device according to claim 3, wherein the evaluating unit includes a microcontroller which is configured to be used by at least one of the current measuring diagnostic unit and the voltage measuring diagnostic unit.

8. A motor vehicle comprising:
a device including a battery having a multiplicity of battery cells and a sensor system for redundant determination of a battery current flowing through poles of the battery, the sensor system including:
  a current measuring device configured generate a first plurality of current measurement values corresponding to detected levels of current through the battery over time with reference to a plurality of measured levels of voltage values over time through a shunt resistor having a predetermined resistance and connected in parallel to the battery;
  a voltage measuring device configured to generate a second plurality of measurements of a voltage level of at least one battery cell in the battery over time; and
  an evaluating unit operatively connected to the current measuring device and the voltage measuring device, the evaluating unit being further configured to:
    identify a variation of the voltage of the battery cell over time with reference to the second plurality of measurements from the voltage measuring device;
    generate a second current measurement value corresponding to the variation in the second plurality of measurements of the voltage level over time with reference to an interpolation of the identified variation of the voltage level over time to a plurality of predetermined current level curves corresponding to a predetermined model of current output levels over a predetermined range of voltage variation levels for the battery over time and not to an internal resistance of the battery;
  identify a variation in the first plurality of current measurement values;
    determine a calculated battery current from the at least one variation with time of the voltage measurement value;
    generate a first output measurement of current flow through the battery corresponding to one current measurement value in the first plurality of current measurement values in response to the variation in the first plurality of current measurement values being less than a predetermined threshold; and
    generate a second output measurement of current flow through the battery corresponding to the second current measurement value in response to the variation in the first plurality of current measurement values being greater than the predetermined threshold.

9. A method for redundant determination of a battery current flowing through poles of a battery, comprising:
providing a battery with a multiplicity of battery cells and a sensor system comprising a current measuring device, a voltage measuring device and an evaluating unit;
generating a first plurality of current measurement values over time corresponding to detected levels of current through the battery over time with reference to a plurality of measured levels of voltage values over time through a shunt resistor having a predetermined resistance and connected in parallel to the battery;
simultaneously generating a second plurality of measurements of a voltage level of at least one battery cell in the battery over time with the voltage measuring device;
identifying a variation of the voltage of the battery cell over time with reference to the second plurality of measurements from the voltage measuring device with the evaluating unit;
determining a second current measurement value for the battery from the at least one variation with time of the voltage measurement value based on an interpolation of the identified variation of the voltage level over time to a plurality of predetermined current level curves corresponding to a predetermined model of current output levels over a predetermined range of voltage variation levels for the battery over time and not to an internal resistance of the battery;
generating a first output measurement of current flow through the battery with the evaluating unit corresponding to one current measurement value in the first plurality of current measurement values in response to the variation in the first plurality of current measurement values being less than a predetermined threshold; and
generating a second output measurement of current flow through the battery with the evaluating unit corresponding to the second current measurement value in response to the variation in the first plurality of current measurement values being greater than the predetermined threshold.

* * * * *